United States Patent
Shaikh et al.

(10) Patent No.: US 9,449,137 B2
(45) Date of Patent: Sep. 20, 2016

(54) BUFFERED CONDUITS FOR HIGH THROUGHPUT CHANNEL IMPLEMENTATION, CROSSTALK DE-SENSITIZATION AND LATE TIMING FIXES ON SKEW SENSITIVE BUSES

(71) Applicant: Texas Instruments Incorporated, Dallas, TX (US)

(72) Inventors: Raashid Moin Shaikh, Bangalore (IN); Vishnuraj Arukat Rajan, Kerala (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 469 days.

(21) Appl. No.: 14/028,811

(22) Filed: Sep. 17, 2013

(65) Prior Publication Data

US 2014/0082248 A1    Mar. 20, 2014

Related U.S. Application Data

(60) Provisional application No. 61/702,035, filed on Sep. 17, 2012.

(51) Int. Cl.
*G06F 13/36* (2006.01)
*G06F 17/50* (2006.01)
*G06F 13/40* (2006.01)

(52) U.S. Cl.
CPC ....... *G06F 17/5081* (2013.01); *G06F 13/4027* (2013.01); *G06F 17/5077* (2013.01)

(58) Field of Classification Search
USPC .............. 710/306–316, 300–304, 104–110
See application file for complete search history.

(56) References Cited

U.S. PATENT DOCUMENTS

| | | | |
|---|---|---|---|
| 6,754,748 B2* | 6/2004 | Fernando | G06F 13/4217 710/100 |
| 8,615,610 B2* | 12/2013 | Miller | G01R 31/318533 710/11 |
| 2010/0155783 A1* | 6/2010 | Law | H01L 27/0207 257/206 |
| 2013/0023106 A1* | 1/2013 | Pickett | G11C 13/0002 438/382 |
| 2013/0246682 A1* | 9/2013 | Jandhyam | G06F 13/1626 710/310 |

* cited by examiner

*Primary Examiner* — Raymond Phan
(74) *Attorney, Agent, or Firm* — Robert D. Marshall, Jr.; Frank D. Cimino

(57) ABSTRACT

A method of manufacturing a system on a chip and a system on a chip including a set of pre-designed modules. These modules are place on a semiconductor and connecting by a set of busses formed according to a set of design rules specifying tracks having a minimum size of conductors and a minimum spacing between conductors. The busses are routed in a preferred direction. The busses include minimum size conductors at alternate tracks within a selected metal layer of the semiconductor and minimum size conductors at alternate tracks in a different metal layer. The conductors in the different metal layer are connected to corresponding connectors in the selected metal layer by vias. Shields of conductors not connected to the bus may be included in tracks not including bus conductors.

14 Claims, 15 Drawing Sheets

|  | 1101 | 1102 | 1103 | 1104 | 1105 | 1106 | 1107 | 1108 | 1109 | 1110 |
|---|---|---|---|---|---|---|---|---|---|---|
| Metal Level 5 | S | E | W | E | S | E | W | E | S | E |
| Metal Level 4 | E | S | E | W | E | S | E | W | E | S |
| Metal Level 3 | S | E | W | E | S | E | W | E | S | E |
| Metal Level 2 | E | S | E | W | E | S | E | W | E | S |

*FIG. 11*

|  | 1201 | 1202 | 1203 | 1204 | 1205 | 1206 | 1207 | 1208 | 1209 | 1210 |
|---|---|---|---|---|---|---|---|---|---|---|
| Metal Level 5 | S | E | W | E | S | E | W | E | S | E |
| Metal Level 4 | W | E | S | E | W | E | S | E | W | E |
| Metal Level 3 | S | E | W | E | S | E | W | E | S | E |
| Metal Level 2 | W | E | S | E | W | E | S | E | W | E |

*FIG. 12*

|        | 1301 | 1302 | 1303 | 1304 | 1305 | 1306 | 1307 | 1308 | 1309 | 1310 |
|--------|------|------|------|------|------|------|------|------|------|------|
| Metal Level 5 | S | S | W | W | W | W | S | S | W | W |
| Metal Level 4 | E | E | E | E | E | E | E | E | E | E |
| Metal Level 3 | S | S | W | W | W | W | S | S | W | W |
| Metal Level 2 | E | E | E | E | E | E | E | E | E | E |

*FIG. 13*
*(Prior Art)*

|        | 1401 | 1402 | 1403 | 1404 | 1405 | 1406 | 1407 | 1408 | 1409 | 1410 |
|--------|------|------|------|------|------|------|------|------|------|------|
| Metal Level 5 | S | E | W | E | W | E | S | E | W | E |
| Metal Level 4 | E | S | E | W | E | W | E | S | E | W |
| Metal Level 3 | S | E | W | E | W | E | S | E | W | E |
| Metal Level 2 | E | S | E | W | E | W | E | S | E | W |

*FIG. 14*

|  | 1501 | 1502 | 1503 | 1504 | 1505 | 1506 | 1507 | 1508 | 1509 | 1510 |
|---|---|---|---|---|---|---|---|---|---|---|
| Metal Level 5 | S | W | W | S | W | W | S | W | W | S |
| Metal Level 4 | E | E | E | E | E | E | E | E | E | E |
| Metal Level 3 | S | W | W | S | W | W | S | W | W | S |
| Metal Level 2 | E | E | E | E | E | E | E | E | E | E |

*FIG. 15*
*(Prior Art)*

|  | 1601 | 1602 | 1603 | 1604 | 1605 | 1606 | 1607 | 1608 | 1609 | 1610 |
|---|---|---|---|---|---|---|---|---|---|---|
| Metal Level 5 | S | E | W | E | W | E | S | E | W | E |
| Metal Level 4 | E | W | E | S | E | W | E | W | E | S |
| Metal Level 3 | S | E | W | E | W | E | S | E | W | E |
| Metal Level 2 | E | W | E | S | E | W | E | W | E | S |

*FIG. 16*

BUFFERED CONDUITS FOR HIGH THROUGHPUT CHANNEL IMPLEMENTATION, CROSSTALK DE-SENSITIZATION AND LATE TIMING FIXES ON SKEW SENSITIVE BUSES

CLAIM OF PRIORITY

This application claims priority under 35 U.S.C. 119(e)(1) to U.S. Provisional Application No. 61/702,035 filed Sep. 17, 2012.

TECHNICAL FIELD OF THE INVENTION

The technical field of this invention is integrated circuit manufacture of connections between pre-designed parts.

BACKGROUND OF THE INVENTION

This invention is directed to module interconnections in system on a chip (SOC) integrated circuits. The advent of increased density integrated circuit manufacture has enabled all or all crucial parts of an end user system to be constructed on a signal integrated circuit. Such integrated circuits are called system on a chip (SOC).

Typically as SOC is constructed using as assortment of previously designed subassemblies. A typical SOC design begins with a system definition. This determines the desired functionality of the SOC. The SOC designer then selects a set of already designed modules to form the desired system. This set of modules may include modules previously designed by the SOC designer or available to the SOC manufacture or modules designed by outside parties available for license to use in the SOC. In some instances a needed module is newly designed or acquired. Part of the selection process includes selecting the set of modules having an aggregate construction size within the budget of the SOC. Integrated circuits are manufactured in slices of silicon of predetermined size. The manufacturing cost of a slice is relatively constant regardless of the number of integrated circuit dies included. Thus more and smaller integrated circuit dies having less electrical circuitry can be fitted on a slice than larger integrated circuit dies. Accordingly, the manufacturing cost of integrated circuits is directly related to its die size. This is in turn related to its electrical complexity. The SOC designer often trades functionality based on electrical complexity with aggregate module size and the consequent cost of manufacture.

The SOC designer then assembles these modules on a single integrated circuit to be manufactured. This process includes forming connections between the modules. These connections often include busses of plural lines in parallel for data and addresses. Determination of the connections between modules in a SOC is often nontrivial. The size of such connections often adversely increases the SOC die size. This typically increases the cost of the SOC. There are often timing issues between modules that must be dealt with in the connections. Busses often involve adverse cross talk between connections or between busses.

SUMMARY OF THE INVENTION

This invention permits a very high occupancy buffered bus channel which is crosstalk de-sensitized. This invention thus enables tighter channel implementation in SOCs thereby reducing die area. This invention enhances the predictability of channel timing closure, especially for skew sensitive buses. This improves top level timing closure cycle time. This invention enables isolation between buses thus localizing the timing/crosstalk impact to the relevant bus. This allows clean, predictable passage of timing critical buses and lesser criticality interfaces through the same channel without interference. This invention enables early prediction of timing criticality in point-to-point connected interfaces in SOCs.

This invention creates a custom-implemented buffered channel using the following key techniques: non-default direction routing; three dimensional inter layer wire spacing rules and shielding; and on route buffering for predictable buffering span.

This invention uses three dimensional wire spacing and custom shielding. According to this invention criticality dependent lane re-assignment is made with minor re-routing. This invention uses non-default direction routing for bus wires. This invention adapts based on bus timing constraints. Because it is structured and predictable, this invention enables timing or functionality aware neighbor signal wire or shield selection for critical signals.

This invention has the following advantages over the prior art. This invention provides bus throughput improvement using non-default direction routing. This invention enables much higher efficiency than conventional place and route tools. This invention enables predictable interface timing closure. This invention is a robust bus routing implementation which reduces the number of vias and jogs. This invention provides less variation. This invention reduces cross talk impact on bus routing. This invention eases source synchronous bus timing closure. This invention enables optimized routing resource utilization. This invention enables early I/O interface timing closure. I/O timing feasibility is known at the floorplan stage according to this invention. This invention reduces project turn around time by identifying interface closure issues at the floorplan stage. This invention permits the alternate of closing SOC level inter-block communication timings very early in the flow. This invention provides uniform bus buffering reducing bus variation with reduced AOCV and reduced SKEW.

BRIEF DESCRIPTION OF THE DRAWINGS

These and other aspects of this invention are illustrated in the drawings, in which:

FIG. 3A illustrates a top view of an example bus and FIG. 3B illustrates a corresponding cross section view;

FIG. 4A illustrates a top view of an example bus and FIG. 4B illustrates a corresponding cross section view;

FIG. 5A illustrates a top view of an example bus and FIG. 5B illustrates a corresponding cross section view;

FIG. 6A illustrates a top view of an example bus and FIG. 6B illustrates a corresponding cross section view;

FIG. 9 illustrates a cross section view of application of this invention to the problem of the prior art of FIG. 8;

FIG. 10 illustrates a cross section view of another example of a prior art disposition of conductors within a bus on a SOC;

FIG. 11 illustrates a cross section view of a first embodiment of this invention modifying the prior art disposition of conductors of FIG. 10;

FIG. 12 illustrates a cross section view of a second embodiment of this invention modifying the prior art disposition of conductors of FIG. 10;

FIG. 13 illustrates a cross sectional view of another example prior art disposition of conductors;

FIG. 14 illustrates a cross section view of an embodiment of this invention modifying the prior art disposition of conductors of FIG. 13;

FIG. 15 illustrates a cross sectional view of another example prior art disposition of conductors;

FIG. 16 illustrates a cross section view of an embodiment of this invention modifying the prior art disposition of conductors of FIG. 15;

DETAILED DESCRIPTION OF PREFERRED EMBODIMENTS

Figure 1:
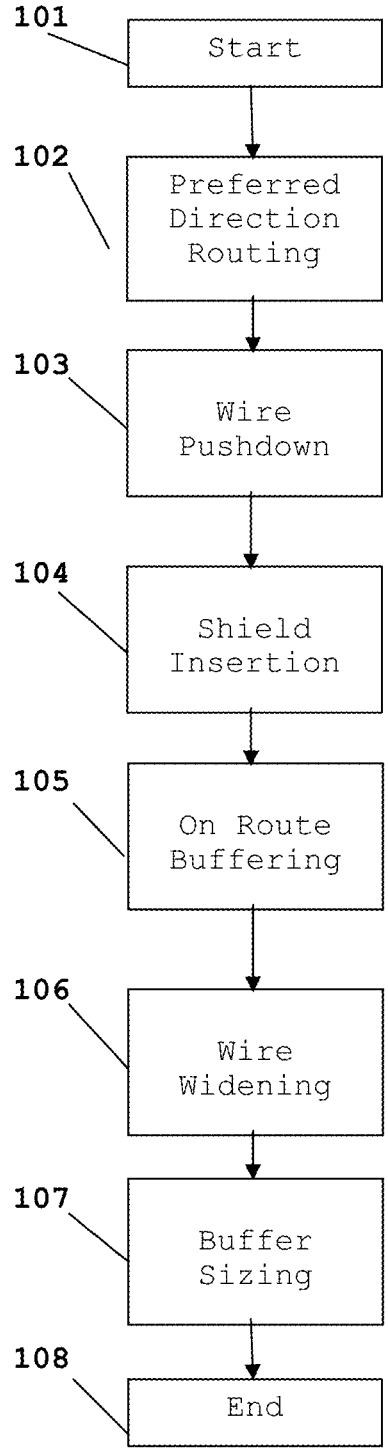
FIG. 1 illustrates the process of this invention.

This invention includes the concept of buffered conduits as pre-implemented buffered bus blocks in the SOC. This invention eliminates all through-fare channels.

In SOCs long, buffered channels for functional buses are fairly common. Such channels normally run long distances in one orientation: North-South; or East-West. Typical prior art place and route solutions honor a preferred direction routing in a strict way while not using available orthogonal routing resources in an efficient manner. This invention includes using high packing density for channel routes by exploiting all available routing resources This invention produces improved channel efficiency. In the conventional flows, channels are sized based on preferred direction routing resources. Conventional place and route rules use alternate orthogonal preferred routing layers, such as: Metal 1 Vertical; Metal 2 Horizontal; and Metal 3 Vertical. Thus a vertical channel implementation using conventional place and route flows may be only using 50% of the available routing tracks. Channel sizing is usually done as follows: the number of Signals to route is R; the Router Efficiency Loss is E, thus if the route was utilizing 90% of the resources, E would be 0.9; the Xtalk based extra spacing is X, where extra spacing per signal will make X=2.0 and no extra spacing will make X=1.0; the number of preferred direction usable routing layers is N. Thus the channel size is given by:

Channel size=$(R*X)/(E*N)$

The invention is advantageous as follows. The invention increases the number of available routing layers to 2*N.

Case #1:
  Let the Original Channel Size be:

$(R*X)/(E*N)$

The Channel size using this invention is:

$(R*X)/(E1*N*2)$ where: E1 is the efficiency of the custom implementation, espesting that E1>E.

Case #2
  Let the Original Channel Size be:

$(R*X)/(E*N)$ where: E<1. Thus X>1.0, we assume X=2.0. Conventional flows don't work with design understanding. Crosstalk impact is actually a function of crosstalk coupling as well as the simultaneous activity of the aggressor and victim nets. If there is a scenario where multiple groups of signals passing through a channel are not simultaneously active, the structured implementation proposed by this invention would enable neighbor selection to avoid simultaneous activity. This would enable avoiding the additional crosstalk derived spacing X. For X=2.0 and E=0.9, the channel size is:

$(R*2.0)/(0.9*N)$.

Using the invention and assuming no improvement in the router efficiency, the channel size is:

$(R*1.0)/(0.9*2*N)$.

This is a very large improvement.

The prior art trades significant silicon area for crosstalk and wide bus routing inefficiencies. The prior art automated wire-spacing implementations are local in their approach and do not equalize white space over larger windows. This invention enables criticality dependent crosstalk desensitization optimization at potentially zero extra cost versus the default highest density routing.

This invention produces improved bus isolation. Channels have through-fare of multiple types of buses. Prior art solutions do not ensure isolation. Source synchronous buses are skew sensitive. Regular synchronous buses have a pure delay sensitivity. This invention enables bus isolation by controlling channel parameters. According to this invention skew sensitive buses get delay-matched lanes. According to this invention slow/pseudo-static buses are power optimized. According to this invention span-delay sensitive buses get fast lanes. None of these influences timing closure on each other because they are isolated.

This invention provides predictability in timing closure cycle time. In the prior art timing closure remains open until the very last moment when all mode/corner static timing analysis (STA) is performed. This invention enables a prefabricated bus. Thus the timing closure is performed at the floorplanning stage. This is very early in the design flow. Late timing fixes can be handled in this invention by trivial lane re-assignments.

The prior art used control of EDA tools space, jog, swizzle routes to reduce cross talk impact. Generally this adds excessive vias and detours. The datapath RC-spreads are quite uncontrolled in the prior art and the timing response across corners can be very poor especially for skew-sensitive buses. This invention strictly controls RC spread, cross corner timing responses and the like. Thus this invention is more robust than the prior art.

FIG. 1 illustrates process 100 of this invention. Process 100 begins with start block 101. Process 100 next executes preferred direction routing step 102. Preferred direction routing step 102 routes required busses among plural modules of a SoC in a preferred direction. This could be either horizontal or vertical. The preferred direction routing depends upon the relative placement of the two connected modules on the SOC. This preferred direction routing includes minimal required spacing between wires according to a custom script with minimal jogging.

Process 100 next executes wire pushdown step 103. Wire pushdown step 103 pushes down nets in alternative track to a lower metal. This routes in the non-preferred direction.

Process 100 next executes shield insertion step 104. Shield insertion step 104 adds shield wires to reduce cross talk.

Process 100 next executes on route buffering step 105. On route buffering step 105 inserts staggered buffers in-line the routing of the bus using custom scripts. This process includes selection of inverting or non-inverting buffers. This invention may include staggered buffers (described below).

Process 100 next executes wire widening step 106. Wire widening step 106 optimizes wire width for additional performance of the bus.

Process 100 next executes buffer sizing step 107. Buffer sizing step 107 selects the buffer size of the various buffers to account for loading mismatches. These loading mismatches could occur from top/bottom layers, difference the number of vias in the routes and other factors. Process 100 ends with end block 108.

This invention has the following advantages. This invention provides logical decoupling. According to this invention different interfaces use different buffered channels alleviating cross talk impact. This invention provides physical decoupling of multiple interface uses. This invention provides high throughput through the use of non-default routing with different configurations of 3D-wire space. This invention provides floorplan level interface timing budgeting and closure. According to this invention the conduits are pre-implemented as modules. Thus the propagation delay and skew across lanes are guaranteed by the module design. This invention provides improved dynamic current-resistance (IR) voltage drop performance. Because the buffering is custom implemented, appropriate decap insertion is possible to reduce the local dynamic IR effects. Each conduit is dynamic IR drop de-sensitized therefore the SOC doesn't see a problem. This invention provides timing window correlation. This invention enables logical correlation based crosstalk minimization in addition to the shielding/spacing options. This invention maximizes utilization of resources. This invention maximizes the available routing resources enabling die area optimization.

Figure 2:
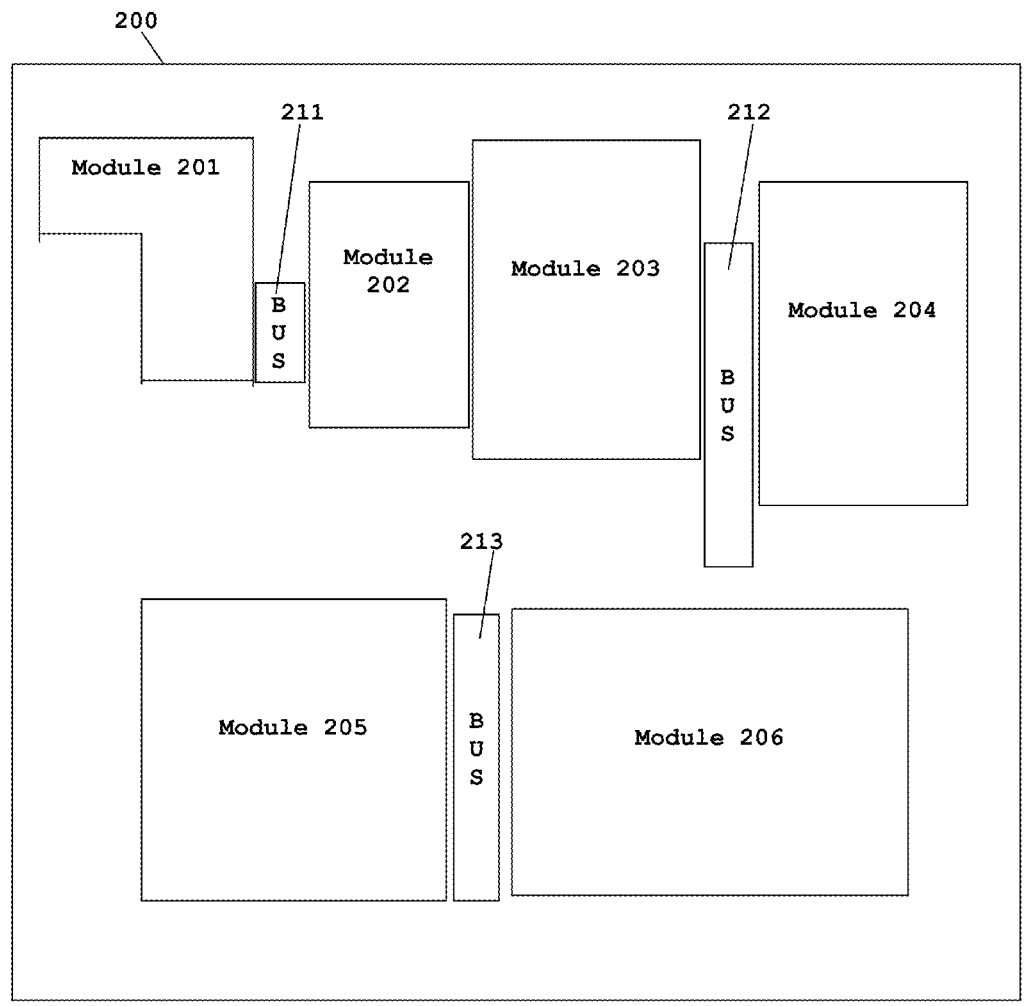
FIG. 2 illustrates an example system-on-chip (SOC) 200 including modules connected by respective buses.

This invention includes pre-built buffered channels. This invention implements channels as pre-built buffered, timing optimized hard blocks that are instantiated at the SOC level. FIG. 2 illustrates an example of this technique.

FIG. 2 illustrates SOC 200 including modules 201, 202, 203, 204, 205 and 206. As illustrated in FIG. 2 bus 211 connects modules 201 and 202, bus 212 connects modules 203 and 204 and bus 213 connects modules 205 and 206.

This invention replaces the original buses 211, 212 and 213 with higher efficiency in timing and area, pre-fabricated units. These pre-fabricated units optimize area, timing closure cycle time and place and route efficiency. Guidance may be needed to ensure routes follow intended paths. Table 1 shows a comparison between the width, height and net count of the original channel buffers and the inventive channel buffers.

TABLE 1

| Buffer Number | | Width | Height | Net Count |
| --- | --- | --- | --- | --- |
| 1 | Original | 183μ | 950μ | 1350 |
| | Invention | 105μ | 950μ | 1350 |
| 2 | Original | 204μ | 1950μ | 2040 |
| | Invention | 160μ | 1950μ | 2040 |
| 3 | Original | 395μ | 2030μ | 4200 |
| | Invention | 325μ | 2030μ | 4200 |

The following observations are made regarding this solution. The channel utilization is not generally balanced. The utilization efficiency is low. The inventors believe that pumping it up can yield die area improvements. A buffer width reduction of about 60μ seems feasible. If the Channels are closed pre-placement, significant improvement in the place and route (PnR) convergence can be achieved. Dependency on the routing engine to take certain routes, for example for channel balancing, can be avoided. This permits a determinists solution to the problem.

This is a significant challenge in prior art SOC place and route methodologies, especially as constraints mature late and quite a few nets are deemed non-critical at the early stages and detoured significantly. Buses 211, 212 and 213 can be pre-constructed as a set of buffered conduits. This involves inserting black box models of these conduits and blocking off the area for PnR. The logical insertion of these into the netlist is much like a buffer insertion. These modules split the net and connect the two pieces to the two end of the conduits.

Another key concept of this invention is three dimensional (3D) wire spacing. This is called 3D because regular "push" happens in the same horizontal or vertical layer. This invention pushes to a layer below or above. This invention works best on low occupancy orthogonal layers which enable higher packing density with sidewall capacitance reduction.

Figure 3A:
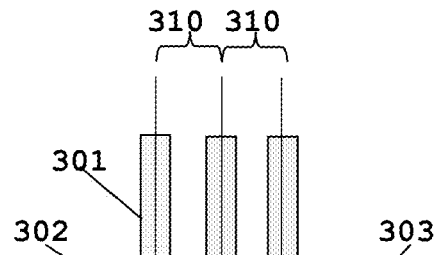
FIGS. 3A and 3B illustrate the results of a prior art first pass bus routing routine.
Figure 3B:
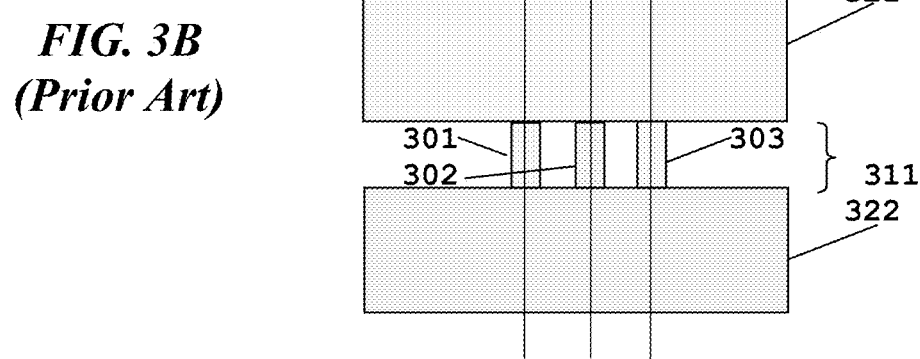

FIGS. 3A and 3B illustrate the results of a prior art first pass bus routing routine. FIG. 3A illustrates a top view of an example bus including conductors 301, 302 and 303. FIG. 3B illustrates a corresponding cross section view. The first pass bus routing routine places a distance 310 between each conductor pair 301-302 and 302-303. Wires are routed as straight as possible generally with minimum spacing between conductors. Custom routing is potentially employed. The routing routine avoids jogs/detours as much as possible. Generally there is no reason to block the layers orthogonal to the signal flow direction. The conductor spacing is typically the minimum distance possible in the target processing node but this is not required. FIG. 3B illustrates that conductors 301, 302 and 303 are disposed between semiconductor layers 321 and 322. As noted in FIG. 3B the plane of the conductors 301, 302 and 303 of this example lie in a region 311, which in this example is metal level 5.

Figure 4A:
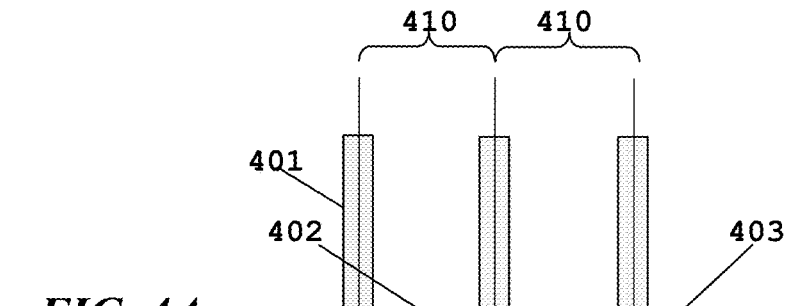
FIGS. 4A and 4B illustrate a prior art design response to excessive cross-talk between conductors.
Figure 4B:
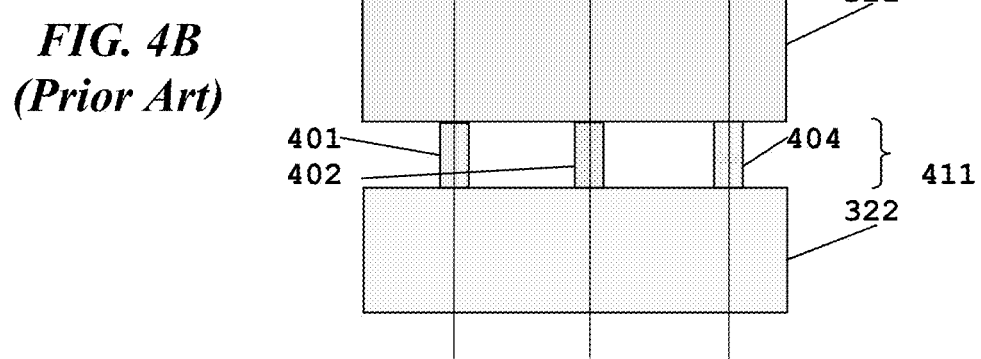

FIGS. 4A and 4B illustrate a prior art design response to excessive cross-talk between conductors 301, 302 and 302. FIG. 4A illustrates a top view of an example bus including conductors 401, 402 and 403. FIG. 4B illustrates a corresponding cross section view. The revised routing places a distance 410 between each conductor pair 301-302 and 302-303. As illustrated in FIG. 4A this distance 410 is greater than the distance 310 illustrated in FIG. 3A. This greater distance tends to reduce the crosstalk between conductors. This reduced crosstalk may be sufficient to meet the bus crosstalk tolerance. FIG. 4B illustrates that conductors 401, 402 and 403 are disposed between semiconductor layers 321 and 322 in metal level 5 in region 411.

Figure 5A:
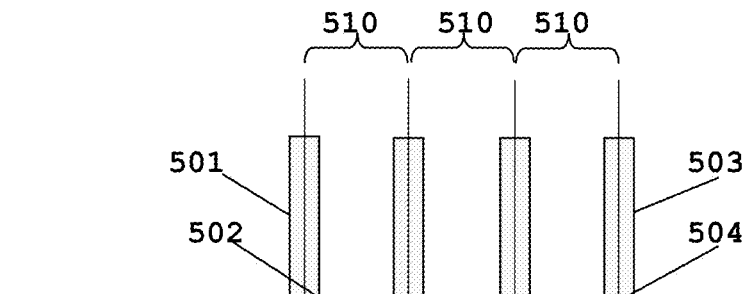
FIGS. 5A and 5B illustrate another prior art design response to excessive cross-talk between conductors.
Figure 5B:
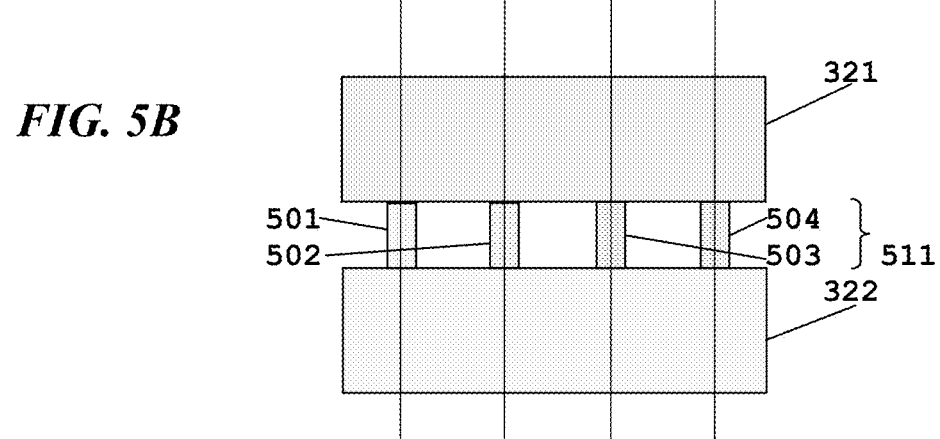

FIGS. 5A and 5B illustrates another example of the results of a prior art first pass bus routing routine. FIG. 5A illustrates a top view of an example bus including conductors 501, 502 and 503. FIG. 5B illustrates a corresponding cross section view. The first pass bus routing routine places a distance 510 between each conductor pair 501-502, 502-503 and 503-504. FIG. 5B illustrates that conductors 501, 502, 503 and 504 are disposed between semiconductor layers 321 and 322. As noted in FIG. 5B the plane of the conductors 501, 502, 503 and 505 of this example lie in metal level 5 region 511.

Figure 6A:
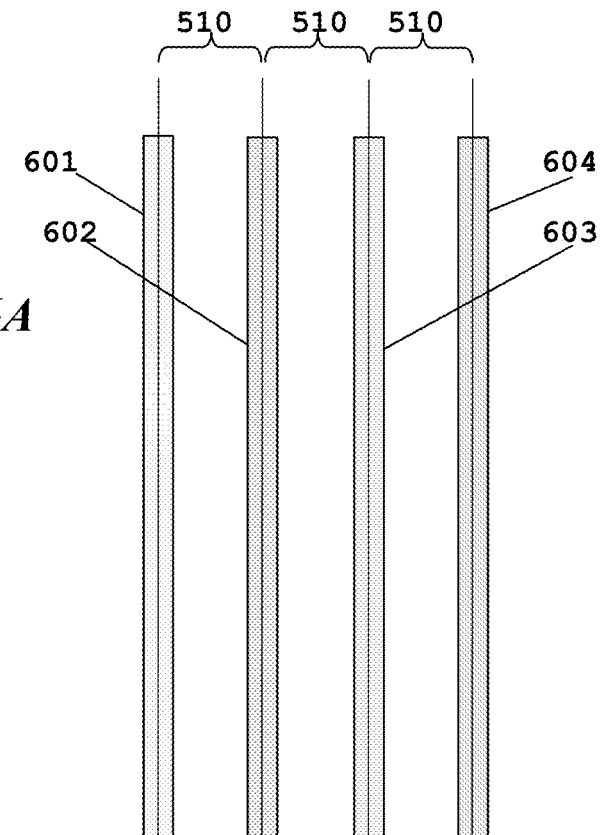
FIGS. 6A and 6B illustrate the inventive response to excessive cross-talk between conductors.
Figure 6B:
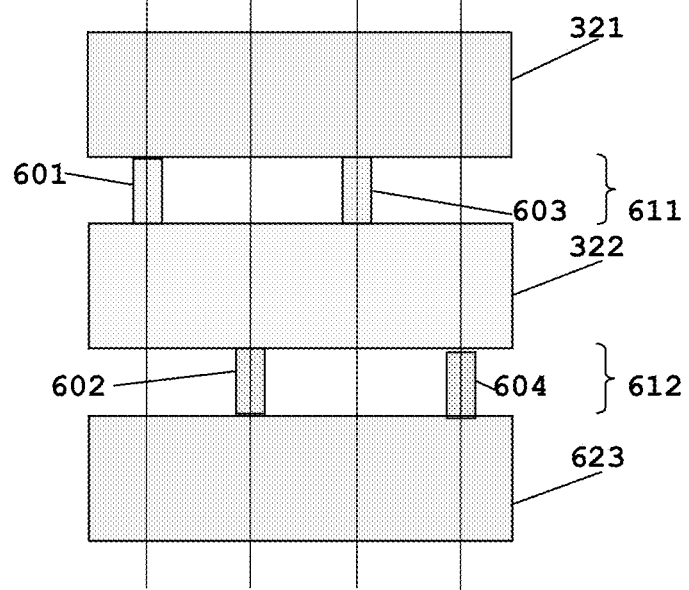

FIGS. 6A and 6B illustrate the inventive response to excessive cross-talk between conductors 501, 502, 503 and 504. This corresponds to step 103 illustrated in FIG. 1. FIG. 6A illustrates a top view of an example bus including conductors 601, 602, 603 and 604. FIG. 6B illustrates a corresponding cross section view. The revised of FIGS. 6A and 6B maintains the same horizontal distance 510 between each conductor pair 601-602, 602-603 and 603-604 as shown in FIG. 5A. As illustrated in FIG. 6B alternate conductors 602 and 604 are pushed down to metal level 4 region 612. FIG. 6B illustrates that conductors 601 and 603 are disposed between semiconductor layers 321 and 322 in metal level 5 in region 611 and that conductors 602 and 604 are disposed between semiconductor layers 322 and 622 in metal level 6 in region 612. This increases the distance between conductor pairs 601-602, 602-603 and 603-604. This greater distance tends to reduce the crosstalk between conductors. This reduced crosstalk may be sufficient to meet the bus crosstalk tolerance.

In accordance with this aspect of the invention alternate tracks are pushed down one metal level after initially routing. These run in long segments in the non-preferred direction. Thus metal level 5 alternate tracks are pushed down to metal level 4 while metal level 4 alternate tracks are pushed down to metal level 3. Open-patch up is done to resolve discontinuities. Spacing/Short cleanup resolves power-grid collisions, pin access collisions and the like. Alternately, the pushdown solution can include a smart handling of this by modeling obstructions and avoiding collisions. Empty tracks can either be left open or metal-filled (shielded) to further reduce conductor cross coupling. Each routing segment not metal-filled can now be widened as well.

Crosstalk de-sensitization can be enhanced in a number of ways. Shield insertion (step 104) employs buffered conduits using the following techniques. The structural uniformity of wire lengths and shield is the important concept. Conventional tool flows do opportunistic shield insertion. This invention guarantees-by-design shield lanes.

Figures 7, 8:
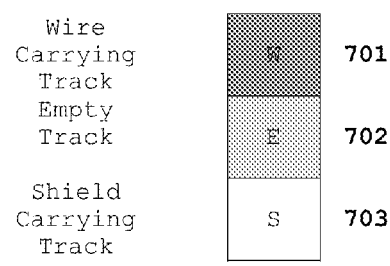
FIG. 7 illustrates the key showing the track types illustrated in FIGS. 8 to 16 including wire carrying tracks, empty tracks and shield carrying tracks.
FIG. 8 illustrates a cross section view of a prior art disposition of conductors within a bus on a SOC.

FIG. 7 illustrates the key showing the track types illustrated in FIGS. 8 to 16. These track types include wire carrying tracks 701, empty tracks 702 and shield carrying tracks 703.

FIG. 8 illustrates a cross section view of a prior art disposition of conductors within a bus on a SOC. FIG. 8 illustrates ten adjacent tracks 801, 802, 803, 804, 805, 806, 807, 808, 809 and 810. Not shown in FIG. 8 is the necessary minimal spacing for insolation between adjacent tracks. FIG. 8 illustrates metal level 5, metal level 4, metal level 3 and metal level 2. FIG. 8 illustrates that all ten tracks 801 to 810 of metal level 5 include wire carrying tracks and ten tracks 801 to 810 of metal level 3 include wire carrying tracks. This prior art arrangement may lead excessive crosstalk between conductors at the same metal layer.

Figures 9, 10:
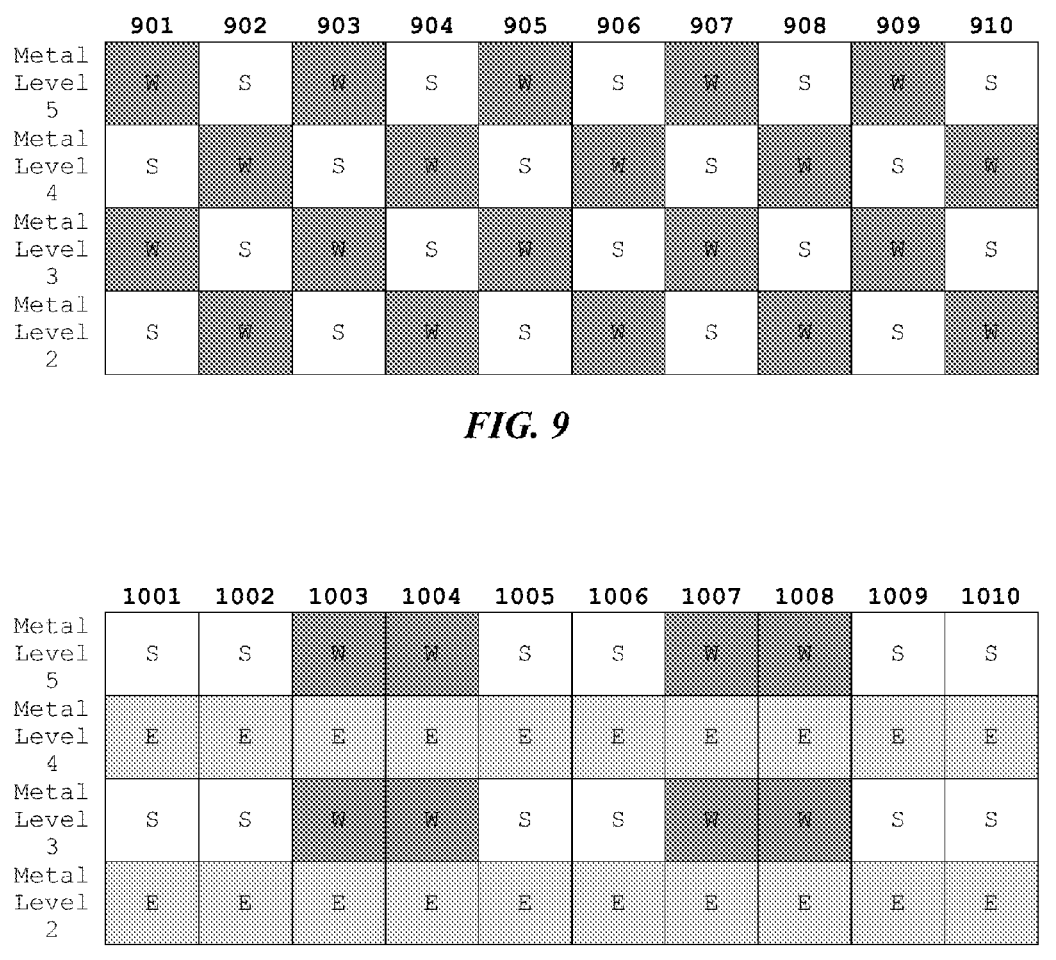

FIG. 9 illustrates a cross section view of application of this invention to the problem of the prior art of FIG. 8. Every other conductor in metal lever 5 (tracks 902, 904, 906, 908 and 910) are pushed down to metal level 4. Every other conductor in metal lever 3 (tracks 902, 904, 906, 908 and 910) are pushed down to metal level 3. FIG. 9 illustrates that all other channel/metal level combinations are shield carrying tracks. This disbursal of the conductors (wire carrying tracks) together with the shield carrying tracks reduces the crosstalk between conductors. This arrangement permits diagonal coupling between wire carrying tracks on plural edges.

FIG. 10 illustrates a cross section view of another example of a prior art disposition of conductors within a bus on a SOC. In FIG. 10 both metal layer 5 and metal layer 3 include alternating two wire carrying tracks and two shield carrying tracks. Every track in metal layer 4 and metal layer 2 is an empty track in FIG. 10.

FIG. 11 illustrates a cross section view of a first embodiment of this invention modifying the prior art disposition of conductors of FIG. 10. Alternate tracks of metal level 5 are pushed down to metal level 4 and alternate tracks of metal level 3 are pushed down to metal level 2. For example: the shield carrying track at track 1102 on metal level 5 is pushed down to metal level 4; the wire carrying track at track 1104 on metal level 5 is pushed down to metal level 4; the shield carrying track at track 1106 on metal level 5 is pushed down to metal level 4; the wire carrying track at track 1108 on metal level 5 is pushed down to metal level 4; and the shield carrying track at track 1110 on metal level 5 is pushed down to metal level 4. The shield carrying and wire carrying tracks on metal level 3 are similarly pushed down to metal level 2. The additional distance between wire carrying tracks and the change distribution of shield carrying tracks reduces the crosstalk between conductors. This arrangement illustrated in FIG. 11 does include diagonal coupling between conductors.

FIG. 12 illustrates a cross section view of a second embodiment of this invention modifying the prior art disposition of conductors of FIG. 10. Alternate tracks of metal level 5 are pushed down to metal level 4 and shifted one track. As an example, the shield in metal level 5 in track 1202 is pushed down to metal level 5 and shifted to track 1203. Similarly the conductor in metal level 5 in track 1204 is pushed down to metal level 4 and shifter to track 1205. Similarly alternate tracks of metal level 3 are pushed down to metal level 2 and shifted one track. This arrangement is believed to provide better crosstalk immunity than the arrangement of FIG. 11. Note that each pair of vertically aligned conductors is separated by a shield track. In addition, no conductors are diagonally adjacent as in FIG. 11. This provides near zero crosstalk at the expense of somewhat greater loading caused by shield capacitance.

FIG. 13 illustrates a cross sectional view of another example prior art disposition of conductors. Metal layer 5 includes shields in tracks 1301, 1302, 1307 and 1308 and conductors in tracts 1303, 1304, 1305, 1306, 1309 and 1310. Metal layer 3 includes a similar disposition of shields and conductors. Every track in metal layer 4 and metal layer 2 is an empty track in FIG. 13.

FIG. 14 illustrates a cross section view of an embodiment of this invention modifying the prior art disposition of conductors of FIG. 13. Alternate tracks of metal level 5 are pushed down to metal level 4 and alternate tracks of metal level 3 are pushed down to metal level 2. For example, the shield in metal layer 5 in track 1402 is pushed down to layer 4, the conductor in metal layer 5 in track 1404 is pushed down to layer 4, the conductor in metal layer 5 in track 1406 is pushed down to layer 4, the shield in metal layer 5 in track 1408 is pushed down to layer 4 and the conductor in metal layer 5 in track 1410 is pushed down to layer 4. Wire carrying tracks are no longer adjacent except diagonally. This provides good crosstalk immunity.

FIG. 15 illustrates a cross sectional view of another example prior art disposition of conductors. Metal layer 5 includes shields in tracks 1501, 1504, 1507 and 1510 and conductors in tracts 1502, 1503, 1504, 1506, 1508 and 1509. Metal layer 3 includes a similar disposition of shields and conductors. Every track in metal layer 4 and metal layer 2 is an empty track in FIG. 15.

FIG. 16 illustrates a cross section view of an embodiment of this invention modifying the prior art disposition of conductors of FIG. 15. Alternate tracks of metal level 5 are pushed down to metal level 4 and alternate tracks of metal level 3 are pushed down to metal level 2. For example, the conductor in metal layer 5 in track 1502 is pushed down to layer 4, the shield in metal layer 5 in track 1504 is pushed down to layer 4, the conductor in metal layer 5 in track 1506 is pushed down to layer 4, the conductor in metal layer 5 in track 1508 is pushed down to layer 4 and the shield in metal layer 5 in track 1510 is pushed down to layer 4. Wire carrying tracks are no longer adjacent except diagonally. This provides good crosstalk immunity.

Figure 17:
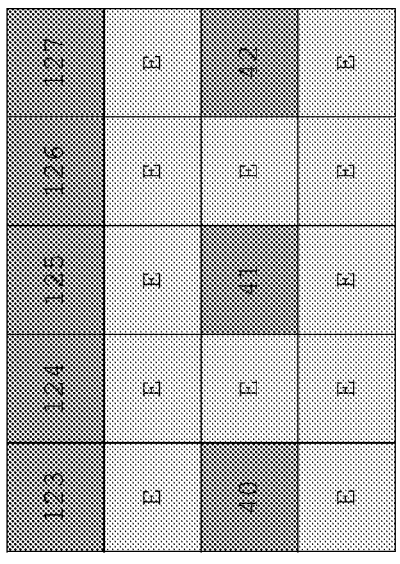
FIG. 17 illustrates the key showing the track types illustrated in FIGS. 18 and 19 including wire carrying tracks, staggered tracks, empty tracks and shield carrying tracks.
Figure 18:
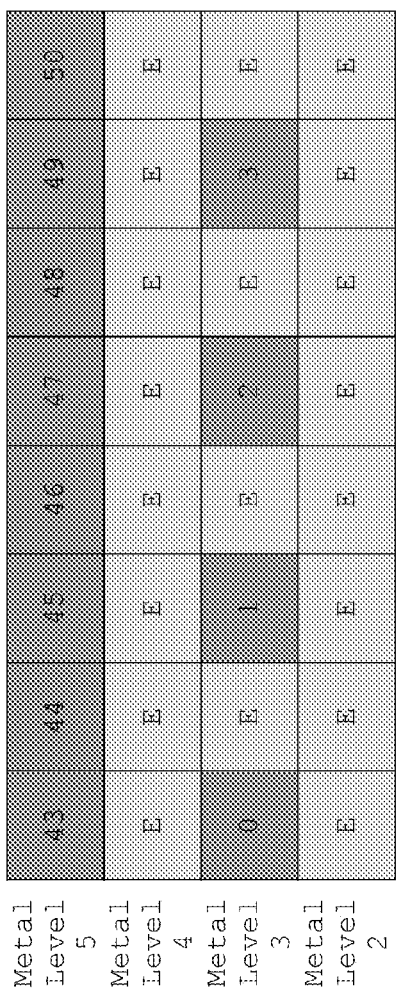
FIG. 18 illustrates a cross sectional view of another example prior art disposition of conductors.
Figure 19:
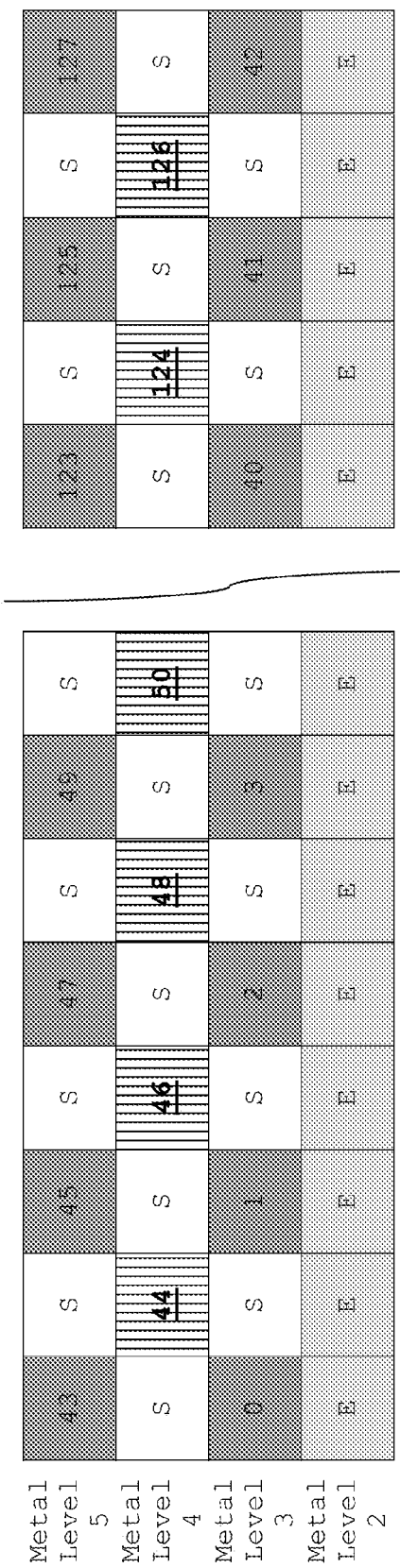
FIG. 19 illustrates a cross section view of an embodiment of this invention modifying the prior art disposition of conductors of FIG. 18.

FIG. 17 illustrates the key showing the track types illustrated in FIGS. 18 and 19. These track types include wire carrying tracks 1701, staggered tracks 1702, empty tracks 1703 and shield carrying tracks 1704.

FIG. 18 illustrates a cross sectional view of another example prior art disposition of conductors. In FIG. 18 metal layer 3 has conductors 0 to 42 in alternate tracks. In FIG. 18 metal layer 5 has conductors 43 to 127 in every track. All tracks in metal layer 4 and 2 at empty. Tracks other than conductors 0 to 42 in metal layer 3 are empty tracks.

FIG. 19 illustrates a cross section view of an embodiment of this invention modifying the prior art disposition of conductors of FIG. 18. Alternate tracks of metal level 5 are pushed down to metal level 4. As shown in FIG. 19 conductors 44, 46, 48 . . . 124 to 126 are now in metal layer 4. Alternate tracks in metal layer 5, metal layer 4 and metal layer 3, those that are not conductors, are replaced with shields. Alternate non-conductor tracks in layer 3 are replaced with shields. Metal layer 2 is unchanged from FIG. 18 to FIG. 19. The resulting changes in FIG. 19 make no conductor horizontally adjacent to another conductor track to track within the same metal layer. In each of metal layers 3, 4 and 5 a shield is in the track between each pair of conductors. In FIG. 19 no conductor is vertically adjacent to another conductor metal layer to metal layer within the same track. The disposition of FIG. 19 provides substantial cross talk isolation between conductor pairs without requiring additional silicon area.

There are two possible topologies. The first topology called EWEW uses alternate empty (E) and conductors (W) in the metal layer tracks. The second topology called SWSW uses alternate shield (S) and conductors (W) in the metal layer tracks. The EWEW topology has lower side-wall loading with a consequent lower wire capacitance and lower active power. The SWSW topology has higher side-wall loading but much lower crosstalk coupling.

Figure 20:
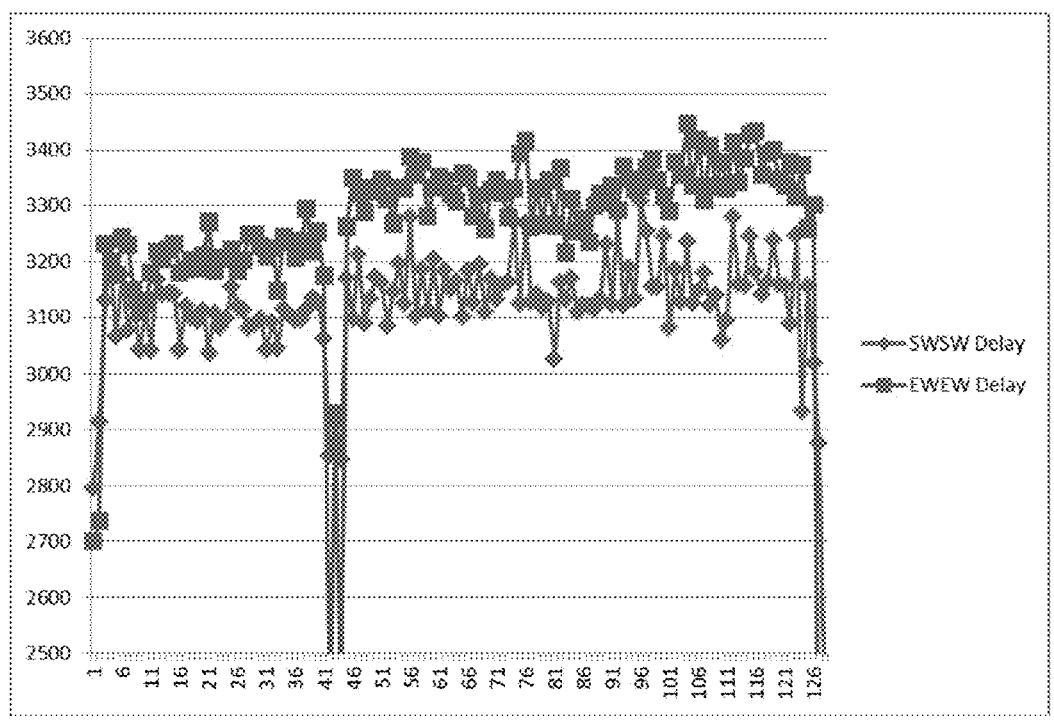
FIG. 20 illustrates the delay versus channel number for the two topologies of bus construction.

FIG. 20 illustrates the delay versus channel number for the two topologies. There are some lanes that spike out in delays. A skew sensitive interface should not use those channels, but they should be left unused.

The per-lane delay distribution can be tightened further by sizing the drivers one notch larger on the slower lanes. For extremely high speed skew sensitive interfaces, another topology is beneficial. This third topology called SEWES employs in adjacent metal layer track: a shield (S); an empty track (E); a conductor (W); an empty track (E); and a shield (S). This shielded and spaced pipe configuration provides high crosstalk immunity. Using this third topology a channel with a slow speed bus and a skew sensitive high speed interface bus can be places in two abutted conduits running in parallel. Power consumption can be controlled via controlling the spanning distance, transistor threshold voltage (VT) choices of the repeaters and side wall loading. Note that side wall shielding causes more capacitance.

Figure 21:
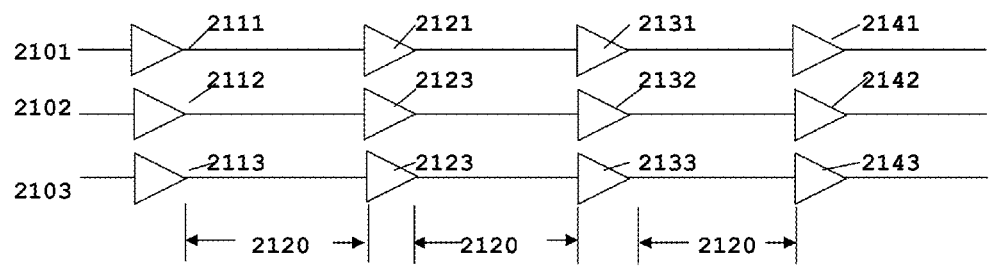
FIG. 21 illustrates in schematic form the prior art aligned bus buffering.

FIG. 21 illustrates an example of a prior art buffered bus. FIG. 21 illustrates what is known as an aligned buffering technique. The bus example in FIG. 21 includes bus lines 2101, 2102 and 2103. This is an illustrative example and an actual integrated circuit bus would typically include more bus lines.

Bus line 2101 has buffers 2111, 2121 and 2131. Bus line 2102 has buffers 2112, 2122 and 2132. Bus line 2103 has buffers 2113, 2123 and 2133. Each bus line includes similarly inserted buffers. Each bus line has an inter-buffer span of 2120. The offset of the first buffer per net from the end of the bus line is the same for each bus line. The integrated circuit designer selects this offset distance based upon the expected losses in bus lines 2101, 2102 and 2103. This results in a parallel set of wires running together followed by a cluster of repeating buffers in these bus lines. FIG. 21 illustrates non-inverting buffers but those skilled in that art would realize that inverting buffers could be employed with this technique.

Figure 22:
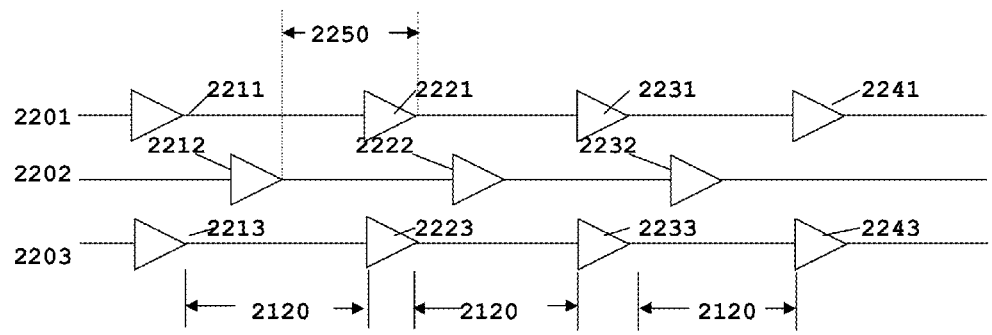
FIG. 22 illustrates in schematic form the inventive staggered buffering.

FIG. 22 illustrates a staggered buffering technique. Each bus line 2201, 2202 and 2203 includes corresponding buffers 2211, 2221, 2231, 2241, 2212, 2222, 2232, 2213, 2223, 2233 and 2243. The inter buffer distance on each bus line 2210 is the same as illustrated in FIG. 21. However, the adjacent lane buffer placement is offset for some bus lines. Thus bus lines 2201 and 2203 are the same as illustrated in FIG. 21. The buffers in bus line 2212 are offset from the buffers in bus lines 2201 and 2203 by an amount 2250. In the preferred embodiment this difference 2250 is about half of the buffering span distance 2210. This offset of buffers on alternate bus lines reduces logical correlation between buffers and results in crosstalk desensitization.

Bus isolation is a key concept of this invention. Each conduit has shields on all layers on the edges. The contained bus is isolated from all surrounding influences and the design context is preserved when the conduit is installed in the SOC environment. Thus slow speed, higher density conduits can co-exist in lanes adjacent extremely skew sensitive high speed lanes. Such grouping allows optimal resource allocation for the right degree of criticality of timing and power.

This invention permits design of multiple buses can be created in a short time independent of the SoC level PnR state. For each automated implementation, the delay per mm, skew per mm, crosstalk impact per mm are easily extracted. These parameters can be used at the SoC-level to enable inter-block budgeting. Based on this information, the SoC design team can validate the floorplan feasibility from a interacting block relative placement perspective.

This invention enables inter-block timing closure. The ability to meet timing on interfaces in the early floor planning phase of the design is advantageous. This invention stretches the signoff tools quite significantly. This invention provides extensive fringe and inter-layer capacitance extraction accuracy when the 3-D field solver to regular extraction validation is performed. This invention provides logical correlation that is used extensively for crosstalk impact reduction.

What is claimed is:

1. A method of manufacturing a system on a chip comprising the steps of:
   selecting a set of pre-designed modules for the system on a chip;
   placing said selected modules on a semiconductor; and
   connecting said set of pre-designed modules via a plurality of buses formed according to a set of design rules specifying tracks having a minimum size of conductors and a minimum spacing between conductors, said connecting including
      routing each bus on a preferred direction,
      placing minimum size conductors of a first set of alternating conductors of each bus at twice the minimum spacing within corresponding first tracks of a selected metal layer of the semiconductor,
      placing minimum size conductors of a second set of alternating conductors of each bus at twice the minimum spacing within corresponding second tracks of a metal layer different than said selected metal layer,
      connecting the alternating track conductors to corresponding conductors in said selected metal layer by vias.

2. The method of manufacturing of claim 1, wherein:
   said connecting step further includes
      placing conductors not connected to the bus in tracks not including bus conductors.

3. The method of manufacturing of claim 1, wherein:
   said connecting step further includes
      forming at least one conductor of at least one bus wider than the minimum size.

4. The method of manufacturing of claim 1, wherein:
   said connecting step further includes
      placing in-line buffers in said conductors of at least one bus along a length of said bus.

5. The method of manufacturing of claim 4, wherein:
   said connecting step further includes
      selecting a drive strength for each of said in-line buffers.

6. The method of manufacturing of claim 4, wherein:
   said connecting step further includes
      placing the in-line buffers having a fixed inter-buffer distance,
      placing a first set of in-line buffers in a first set of alternative bus lines at an offset relative to a second set of in-line buffers in a second set of alternative bus lines.

7. The method of manufacturing of claim 4, wherein:
   said offset is half said inter-buffer distance.

8. A system on a chip comprising:
   a set of pre-designed modules placed on a semiconductor; and
   a plurality of buses formed according to a set of design rules specifying tracks having a minimum size of conductors and a minimum spacing between conductors connecting said set of pre-designed modules, each of said plurality of buses
      routed on a preferred direction,
      including a first set of minimum size conductors at twice the minimum spacing within first alternating tracks of a selected metal layer of the semiconductor,
      including a second set of minimum size conductors at twice the minimum spacing within second alternating tracks of a metal layer different than said selected metal layer, said second set of conductors offset from said first set of conductors by the minimum spacing, said second set of conductors on said different metal layer connected to corresponding conductors in said selected metal layer by vias.

9. The system on a chip of claim 8, wherein:
   at least one bus includes conductors not connected to the bus in tracks not including bus conductors.

10. The system on a chip of claim 8, wherein:
    at least one bus includes at least one conductor wider than the minimum size.

11. The system on a chip of claim 8, wherein:
    at least one bus included in-line buffers in said conductors staggered along a length of said bus.

12. The system on a chip of claim 11, wherein:
    said in-line buffers have selected drive strength.

13. The system on a chip of claim 11, wherein:
    said in-line buffers have a fixed inter-buffer distance; and
    wherein a first set of in-line buffers in a first set of alternative bus lines have an offset relative to a second set of in-line buffers in a second set of alternative bus lines.

14. The method of manufacturing of claim 11, wherein:
    said offset is half said inter-buffer distance.

* * * * *